United States Patent
Subramanian et al.

(10) Patent No.: US 6,653,221 B1
(45) Date of Patent: *Nov. 25, 2003

(54) METHOD OF FORMING A GROUND IN SOI STRUCTURES

(75) Inventors: Ramkumar Subramanian, San Jose, CA (US); Bharath Rangarajan, Santa Clara, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 17 days.

This patent is subject to a terminal disclaimer.

(21) Appl. No.: 09/824,350

(22) Filed: Apr. 2, 2001

(51) Int. Cl.[7] .................. H01L 21/4763; H01L 29/00
(52) U.S. Cl. ................. 438/620; 438/638; 257/508
(58) Field of Search .................. 257/347, 508; 438/361, 348, 620

(56) References Cited

U.S. PATENT DOCUMENTS

| | | | | |
|---|---|---|---|---|
| 5,034,347 A | * | 7/1991 | Kakihana | 438/620 |
| 5,266,515 A | * | 11/1993 | Robb et al. | 148/DIG. 126 |
| 5,633,201 A | * | 5/1997 | Choi | 438/620 |
| 5,990,507 A | * | 11/1999 | Mochizuki et al. | 257/295 |
| 6,180,986 B1 | * | 1/2001 | Ishida | 257/350 |
| 6,303,954 B1 | * | 10/2001 | Ohoka | 257/296 |
| 6,335,249 B1 | * | 1/2002 | Thei et al. | 438/296 |
| 6,337,253 B1 | * | 1/2002 | Davari et al. | 438/155 |
| 6,355,950 B1 | * | 3/2002 | Livengood et al. | 257/276 |
| 6,372,562 B1 | * | 4/2002 | Matsumoto | 438/142 |

* cited by examiner

Primary Examiner—Steven Loke
Assistant Examiner—Samuel A Gebremariam
(74) Attorney, Agent, or Firm—Amin & Turocy, LLP

(57) ABSTRACT

An SOI device structure is provided which facilitates mitigation of charge build up caused by floating body effects. A ground contact is formed from a top insulating layer to a bottom silicon layer. The ground contact extends through the insulating layer, a stop layer, an isolation region and an oxide layer to the bottom silicon layer. The ground contact is fabricated along with the formation of local interconnects.

15 Claims, 9 Drawing Sheets

METHOD OF FORMING A GROUND IN SOI STRUCTURES

FIELD OF THE INVENTION

The present invention generally relates to the design of field effect transistors (FETS) and, more particularly, to a method of mitigating charge on the surface of Silicon-on-Insulator (SOI) products.

BACKGROUND OF THE INVENTION

As is known in the art, transistors such as metal oxide silicon (MOS) transistors, have been formed in isolated regions of a semiconductor body such as an epitaxial layer which was itself formed on a semiconductor, typically bulk silicon, substrate. With an n-channel MOS field effect transistor (FET), the body is of p-type conductivity and the source and drain regions are formed in the p-type conductivity body as $N^+$ type conductivity regions. With a p-channel MOSFET, the body, or epitaxial layer, is of n-type conductivity and the source and drain regions are formed in the n-type conductivity body as $P^+$ type conductivity regions. It has been suggested that the semiconductor body, or layer, be formed on an insulating substrate, or over an insulation layer formed in a semiconductor substrate. Such technology sometimes is referred to as Silicon-on-Insulator (SOI) technology. Silicon-on-Insulator MOS technologies have a number of advantages over bulk silicon MOS transistors. These advantages include: reduced source/drain capacitance and hence improved speed performance at higher-operating frequencies; reduced $N^+$ to $P^+$ spacing and hence higher packing density due to ease of isolation; and higher "soft error" upset immunity (i.e., the immunity to the effects of alpha particle strikes).

Silicon-on-Insulator technology is characterized by the formation of a thin silicon layer for formation of the active devices over an insulating layer, such as an oxide, which is in turn formed over a substrate. Transistor sources in drains are formed by, for example, implantations into the silicon layer while transistor gates are formed by forming a patterned oxide and conductor (e.g. metal) layer structure. Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). However, the floating body can introduce dynamic instabilities in the operation of such a transistor.

An SOI field effect transistor combines two separated immunity groups, generally formed by implantation, constituting the source and drain of the transistor with the general region (device body) between them covered by a thin gate insulator and a conductive gate. Typically no electrical connection is made to the channel region and therefore the body is electrically floating. Because the source and drain regions normally extend entirely through the thin silicon layer, the electrical potential of the body is governed by Kirchoff's current law, wherein the sum of the currents flowing into the body equals the sum of the currents flowing out of the body. Because the channel potential is dependent on the body voltage, the device threshold voltage varies as a function of the body voltage.

In SOI transistors there is a lack of a bulk silicon or body contact to the MOS transistor. In some devices, it is desirable to connect the p-type conductivity body in the case of an n-channel MOSFET, or the n-type conductivity body in the case of a p-channel MOSFET, to a fixed potential. This prevents various hysteresis effects associated with having the body potential "float" relative to ground. Additionally, this mitigates a build up of charge on the active silicon layer that can occur during fabrication and operation of the SOI transistors. Therefore, improvements for mitigating the aforementioned problems with SOI devices is desirable.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to formation of a ground contact on an SOI product to mitigate charge buildup on the surface of the SOI device. A ground contact is formed from a top insulating layer to a bottom silicon layer to dissipate charge buildup. The ground contact extends through the insulating layer, a stop layer, a trench isolation region and an oxide layer to the bottom silicon layer. The ground contact is fabricated along with the formation of local interconnects. The ground opening is formed prior to the vias and trenches for forming contact patterns. Although, the resist will flow into the ground opening during the standard contact mask, the large size of the ground contact will help in the resist being removed easily. Additionally, since the number of ground contacts is significantly smaller than the actual contacts difficulty in removing the resist is mitigated.

To the accomplishment of the foregoing and related ends, the invention, then, comprises the features hereinafter fully described and particularly pointed out in the claims. The following description and the annexed drawings set forth in detail certain illustrative examples of the invention. These examples are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
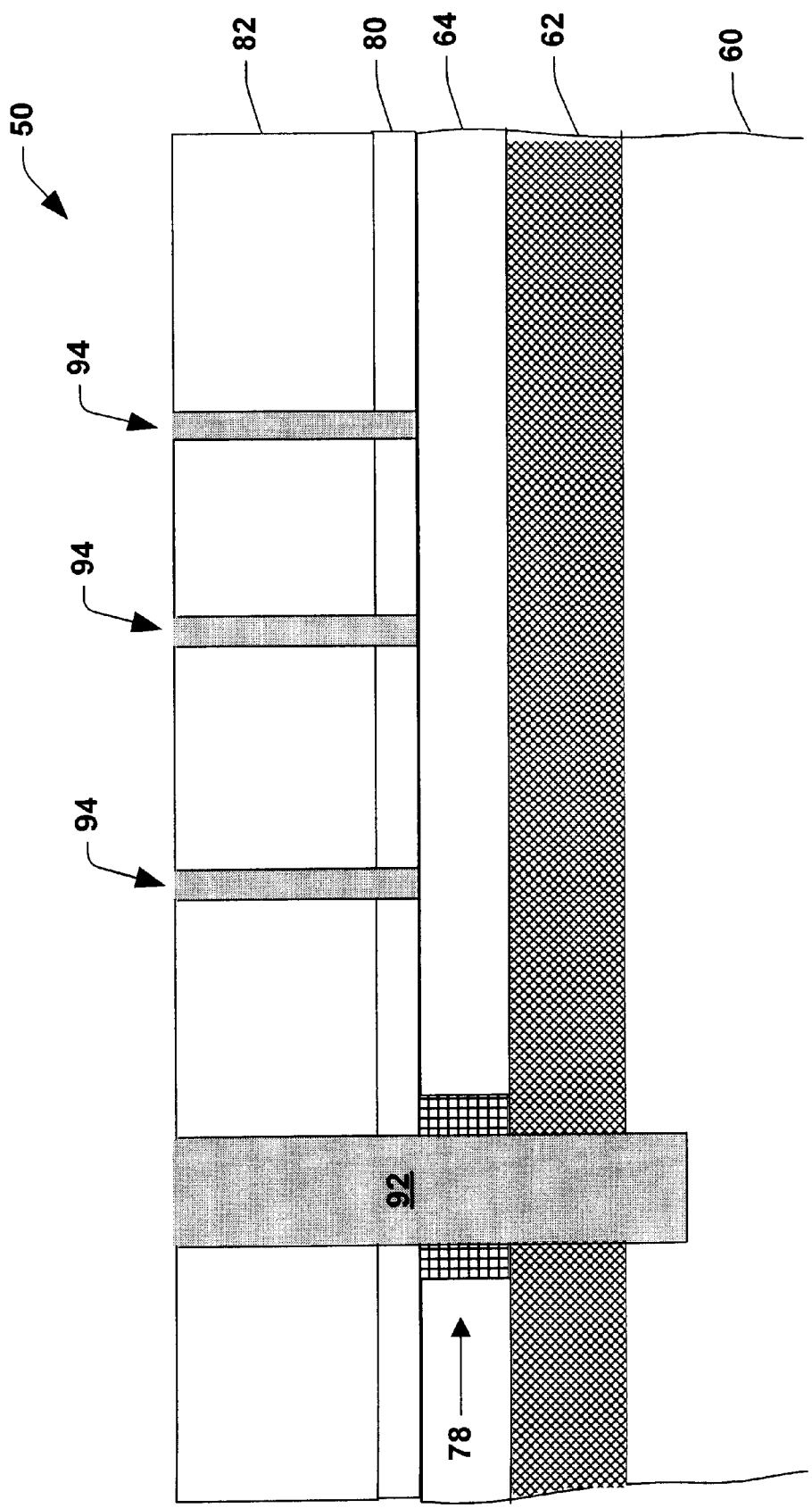
FIG. 1 is schematic cross-sectional illustration of an SOI structure in accordance with one aspect of the present invention.

The present invention relates to an SOI device structure which facilitates mitigation of charge build up caused by floating body effects, and a method for making the same. A ground contact is formed from a top insulating layer to a bottom silicon layer. The ground contact extends through the insulating layer, a stop layer, an isolation region and an oxide layer to the bottom silicon layer. The ground contact is fabricated along with the formation of local interconnects. Local interconnects are used to form short contacts connecting conducting regions of semiconductor devices to pads, contacts or other devices on another layer. Local interconnects are also used to form conducting lines to connect multiple devices to one another.

For example, a local interconnect can be used to form a short metal contact to a gate of a transistor and a conducting line can be formed to connect the drains of several transistors along a path. During formation of a local interconnect from a device to another layer, an etch is performed on an insulating layer that connects conducting members between layers. The etching forms vias and trenches to be filled with metal to form contacts and conductive lines. Typically, the insulating layer material is a material, such as silicon oxide or silicon dioxide. An etching stop layer is provided between the silicon oxide or silicon dioxide layer to protect the conductive device during etching of the insulating layer. Typically, the etching stop layer is a silicon oxynitride (SiON) or a silicon nitride (SiN) layer. The nitride layer has an undesirable higher dielectric than the oxide, and further requires an additional etching of the nitride layer after etching the oxide layer to expose a via or trench from the insulating layer to the conductive region of the conductive member.

The present invention will now be described with reference to the drawings, wherein like reference numerals are used to refer to like elements throughout. Although the present invention is described primarily in connection with an SOI device structure, the present invention may be employed in connection with bulk device structures as well. It should be understood that the description of this preferred embodiment is merely illustrative and that it should not be taken in a limiting sense.

FIG. 1 is a schematic cross-sectional illustration of an SOI device structure 50 in accordance with the present invention. The device structure 50 includes a base 60 comprising silicon, for example. The base 60 provides mechanical support for the device structure 50, and is of a thickness suitable for providing such support. An oxide layer 62 e.g., $SiO_2$, $Si_3N_4$) is formed over the base 60. A top silicon layer 64 is shown formed over the oxide layer 62. The top silicon layer 64 becomes the active region for device fabrication. Shallow isolation trenches 78 isolate the active region of the device 50. A stop layer 80 resides over the top silicon layer 64 and an insulating layer 82 resides over the stop layer 80. A plurality of contacts and conducting lines 94 extend from the top surface of the insulating layer 82 to the top silicon layer 64. A ground contact 92 extends from the top surface of the insulating layer 82 through the stop layer 80, the shallow isolation trench 78, the oxide layer 62 to the silicon layer 60. The ground contact dissipates charge build up on the SOI structure 50. It is to be appreciated that although only one ground contact and shallow isolation trench is illustrated, several ground contacts may be formed through several isolation trenches in accordance with the present invention.

Figure 2:
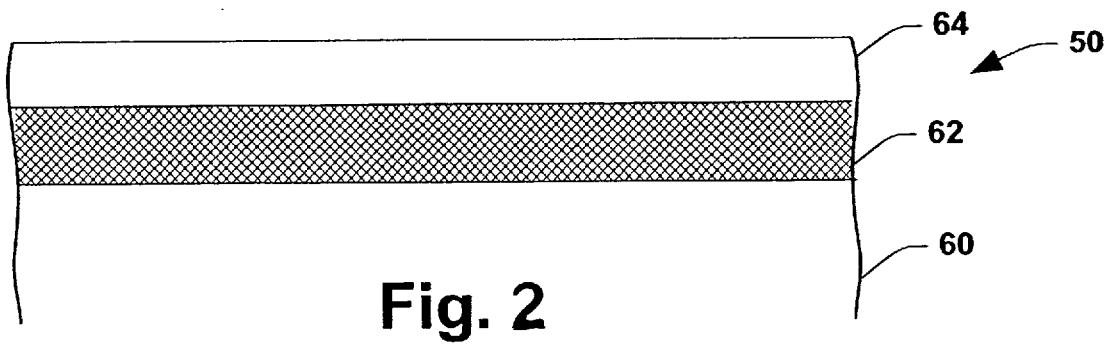
FIG. 2 is a schematic cross-sectional illustration of an SOI substrate in accordance with aspect the present invention.

Turning now to FIGS. 2–25, fabrication in connection with forming the structure 50 of FIG. 1 are discussed. FIG. 2 illustrates a basic SOI structure in its early stages of fabrication. The structure includes the silicon base 60, the silicon oxide layer 62 and the top silicon layer 64. This basic structure is formed preferably via a SIMOX (Separation by Implantation of Oxygen) process. The basic steps of the SIMOX process involve implanting oxygen beneath the surface of a silicon wafer. An annealing step is next performed to coalesce the implanted oxygen atoms into a uniform layer of $SiO_2$. Sometimes, epitaxial silicon may be grown atop the silicon to satisfy specific device requirements, but with or without an epitaxial layer, the top surface film 64 becomes the active region for device fabrication. The buried oxide layer 62 is typically 0.1 to 0.5 $\mu$m thick and exhibit almost complete incorporation of the implanted oxygen. Typical implant energies range from 150 to 200 keV, while the oxygen dose may vary from 1 to 2E18 $cm^{-2}$. The top silicon film 64 thickness as well as the variation thereof with respect to the oxide layer 62 thickness is a function of the implant energy as well as the rate of surface silicon sputtering during the implant process.

A second step in the SIMOX process is high temperature annealing. Such annealing is typically performed at temperatures greater than 1250° C. for several hours to coalesce the implanted oxygen and achieve solid state recrystallization of the top superficial) silicon layer 64 from the surface downward.

FIGS. 3–8 illustrate process blocks associated with fabrication of isolation regions of the SOI device 50 (FIG. 1) in accordance with the present invention. The present process relates to shallow trench isolation (STI), which involves etching a trench into the top silicon layer 64 and filling the trench with an isolation material. Local oxidation of silicon (LOCOS) isolation processes generally occupy a great deal of wafer surface area, and thus STI provides for an alternative isolation technique.

Figure 3:
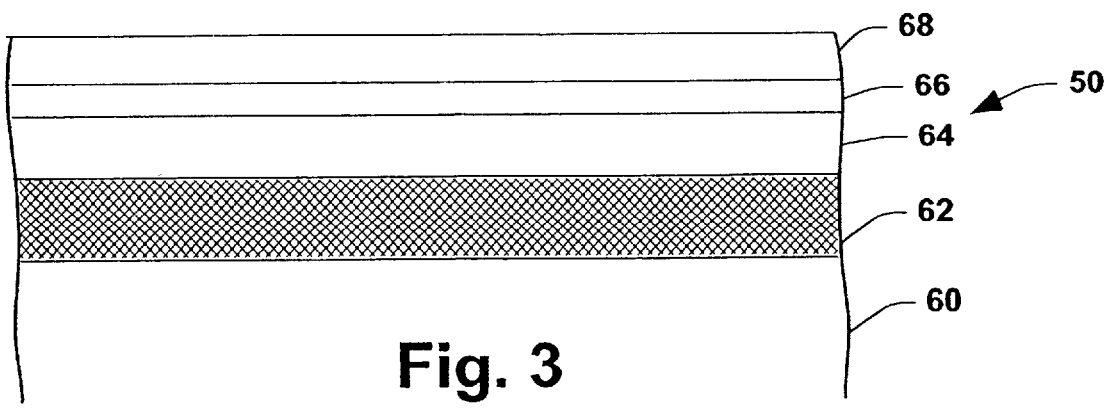
FIG. 3 is a schematic cross-sectional illustration of the SOI substrate of FIG. 2 with a pad oxide layer and nitride layer formed thereon in accordance with one aspect of the present invention.
Figure 4:
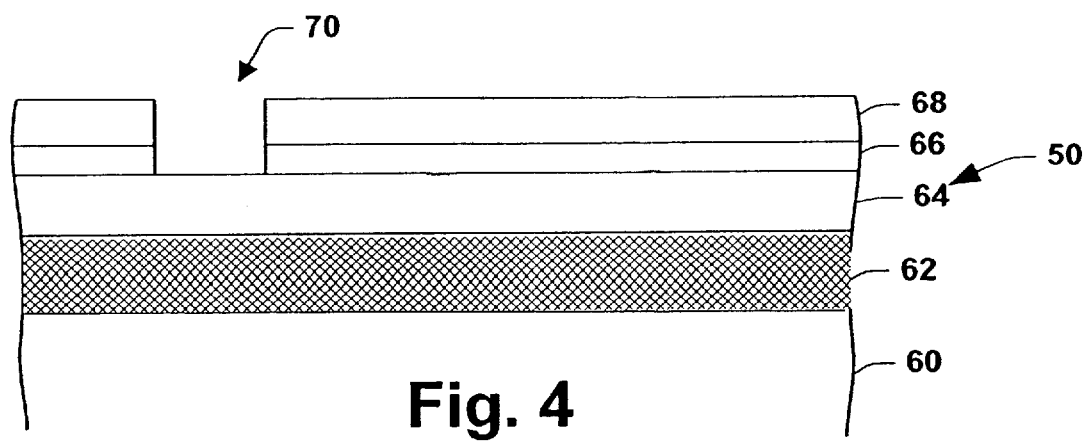
FIG. 4 is a schematic cross-sectional illustration of the structure of FIG. 3 with isolation regions formed therein in accordance with one aspect of the present invention.

FIG. 3 illustrates a pad oxide layer 66 and a layer of nitride 68 formed on the surface of the top silicon layer 64. The pad oxide layer 66 can have a thickness of approximately 200 Å and may be thermally grown at a temperature of approximately 900° C. for a period of 40 minutes. The nitride layer 68 is deposited on the surface of the pad oxide layer 66 via a chemical vapor deposition (CVD) process to a thickness of approximately 2000 Å. A conventional photoresist process is then utilized to pattern and etch the nitride layer 68 and the pad oxide layer 66 in order to result in the structure shown in FIG. 4. Such photoresist process includes use of an STI mask which defines isolation region 70.

Figure 5:
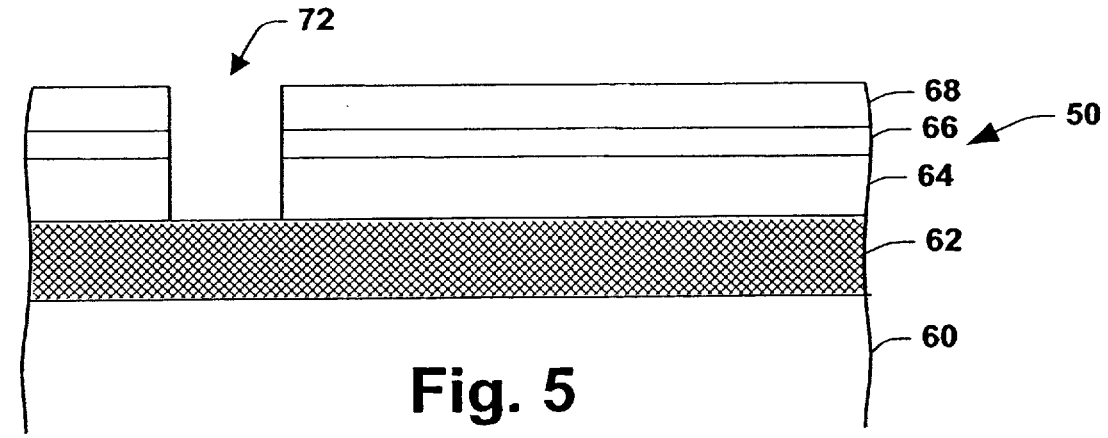
FIG. 5 is a schematic cross-sectional illustration of the structure of FIG. 4 with shallow isolation trenches formed at the isolation regions in accordance with one aspect of the present invention.

Next, as represented in FIG. 5, a silicon etch is performed so as to form shallow trench 72 within the top silicon layer 64 at the isolation region 70. In particular, a trench resist material (not shown) is applied to cover the structure and is then patterned to expose the isolation region 70. The shallow trench 72 is then etched into the top silicon layer 64 using suitable techniques. The trench resist material is thereafter stripped so as to result in the structure shown in FIG. 5.

Figure 6:
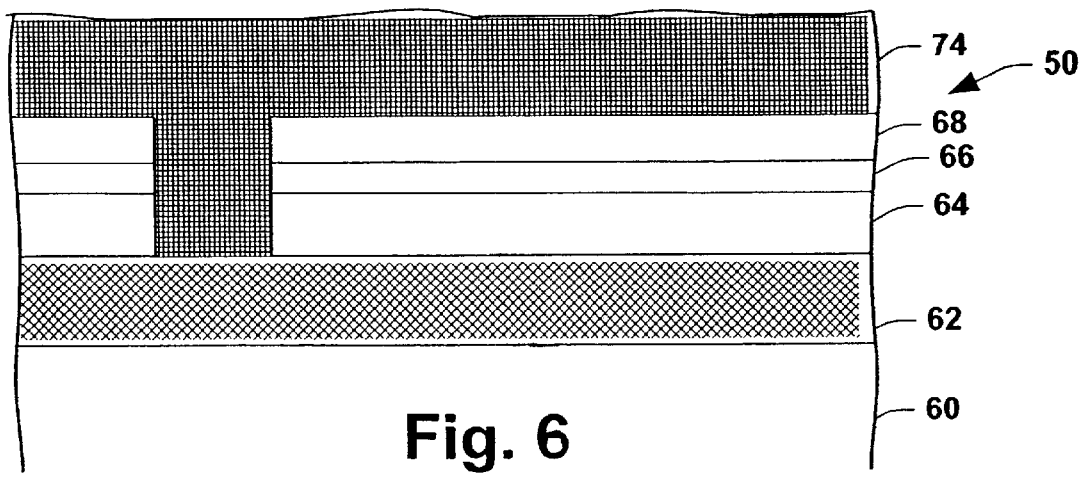
FIG. 6 is a schematic cross-sectional illustration of the structure of FIG. 5 with an oxide layer formed thereon so as to fill the isolation trenches in accordance with one aspect of the present invention.
Figure 7:
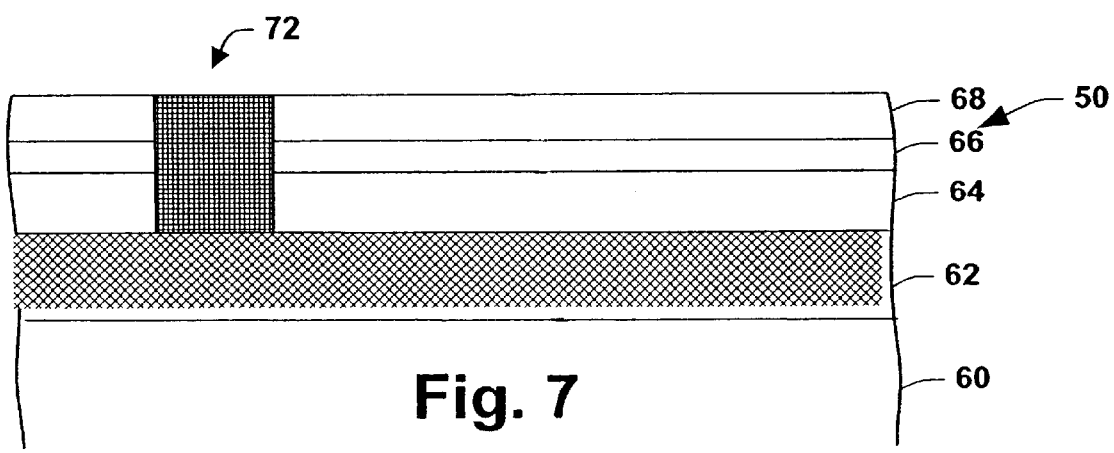
FIG. 7 is a schematic cross-sectional illustration of the structure of FIG. 6 after the oxide layer has been polished down to the surface of the nitride layer in accordance with one aspect of the present invention.

Following the formation of the trench 72 via the silicon etch, a layer of oxide material 74 is formed on the structure using high density plasma chemical vapor deposition (HDPCVD) in order to fill fully the isolation region with the oxide material 74 shown in FIG. 6. As is known, HDPCVD is a self-planarizing process which facilitates reduction of the chemical mechanical polishing (CMP) times required in subsequent steps. (See, e.g., Pye, J. T. et al., *High-density plasma CVD and CMP for 0.25-μm intermetal dielectric processing*, Solid State Technology, December 1995, pgs. 65–71). Following deposition of the oxide material 74, the oxide material 74 is polished via chemical mechanical polishing (CMP) down to the surface level of the nitride layer 68 as shown in FIG. 7. Consequently, the insulative oxide material 74 in the trench 72 remains. The upper surface of the oxide material 74 is substantially even with the upper surface of The nitride layer 66.

Figure 8:
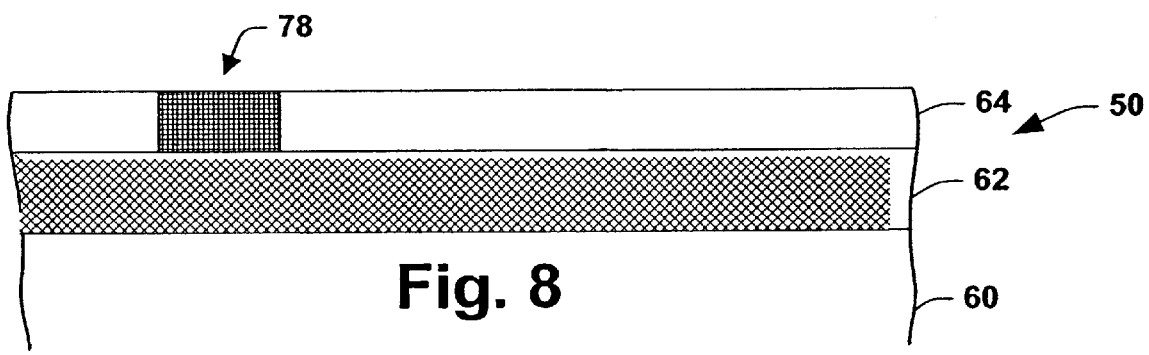
FIG. 8 is a schematic cross-sectional illustration of the structure of FIG. 7 after the nitride layer, pad oxide layer and portions of the oxide layer have been etched away in accordance with one aspect of the present invention.
Figure 9:
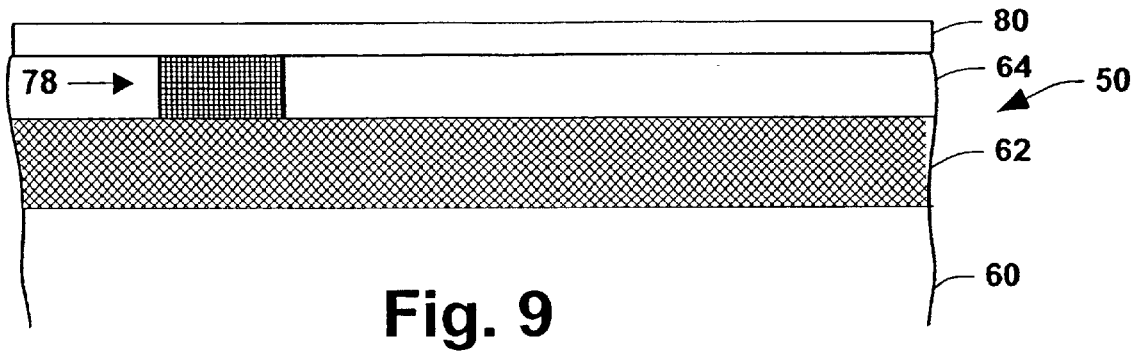
FIG. 9 is a schematic cross-sectional illustration of the structure of FIG. 8 after a stop layer is formed thereon in accordance with one aspect of the present invention.

As is represented in FIG. 8, the nitride layer 68 and pad oxide layer 66 are stripped a way using a suitable stripping process. The strip process also results in the top surface of the oxide material 74 being etched to a level substantially even with the surface of the top silicon layer 64. Thus, the formation of a shallow isolation trench 78 is substantially complete in relevant part.

Turning now to FIGS. 9–25, process blocks in connection with completion of the SOI device 50 in accordance with the present invention are described. A stop layer 80 is formed over the top silicon layer 64 (FIG. 9) using CVD techniques. Typically, the etching stop layer is a silicon oxynitride (SiON) or a silicon nitride (SiN) layer. Alternatively, the stop layer can be titanium nitride (TiN). Any suitable technique for forming the stop layer 80 may be employed such as Low Pressure Chemical Vapor Deposition (LPCVD), Plasma Enhanced Chemical Vapor Deposition (PECVD), High Density Chemical Plasma Vapor Depositon (HDPCVD), sputtering or high density plasma chemical vapor deposition (HDPCVD) techniques to a thickness suitable for serving as a hard mask for a selective etch of the top silicon layer 64. Thus, for example, in one aspect of the present invention the thickness of the stop layer 80 is between the range of about 50 Å–5000 Å. In another aspect, the thickness of the stop layer 80 is between the range of about 50 Å–3000 Å. In another aspect, the thickness of the stop layer 80 is between the range of about 50 Å–2000 Å. In another aspect, the thickness of the stop layer 80 is between the range of about 50 Å–1500 Å. In another aspect, the thickness of the stop layer 80 is between the range of about 50 Å–1000 Å. In still another aspect, the thickness of the stop layer 80 is between the range of about 50 Å–500 521 .

Figure 10:
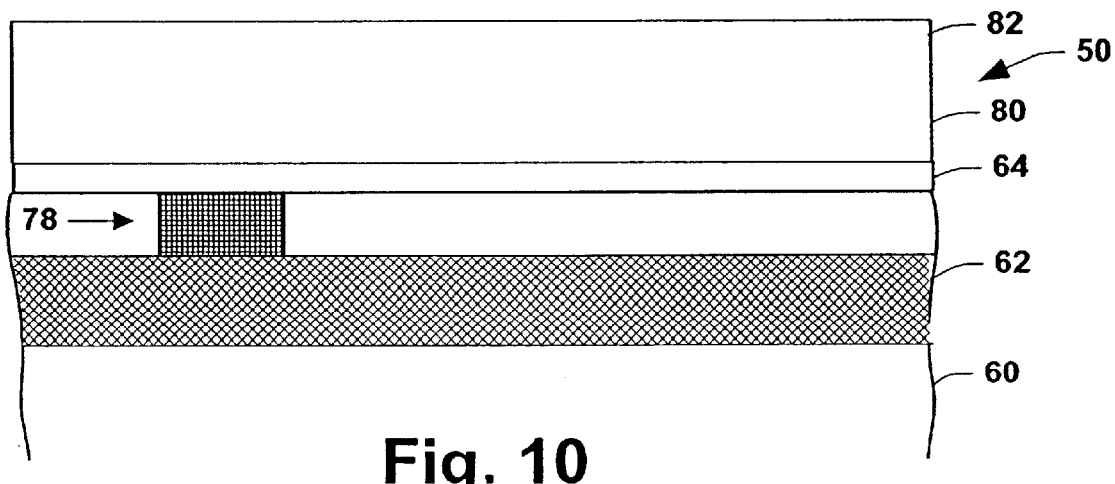
FIG. 10 is a schematic cross-sectional illustration of the structure of FIG. 9 after an insulating layer is formed over the stop layer in accordance with one aspect of the present invention.
Figure 11:
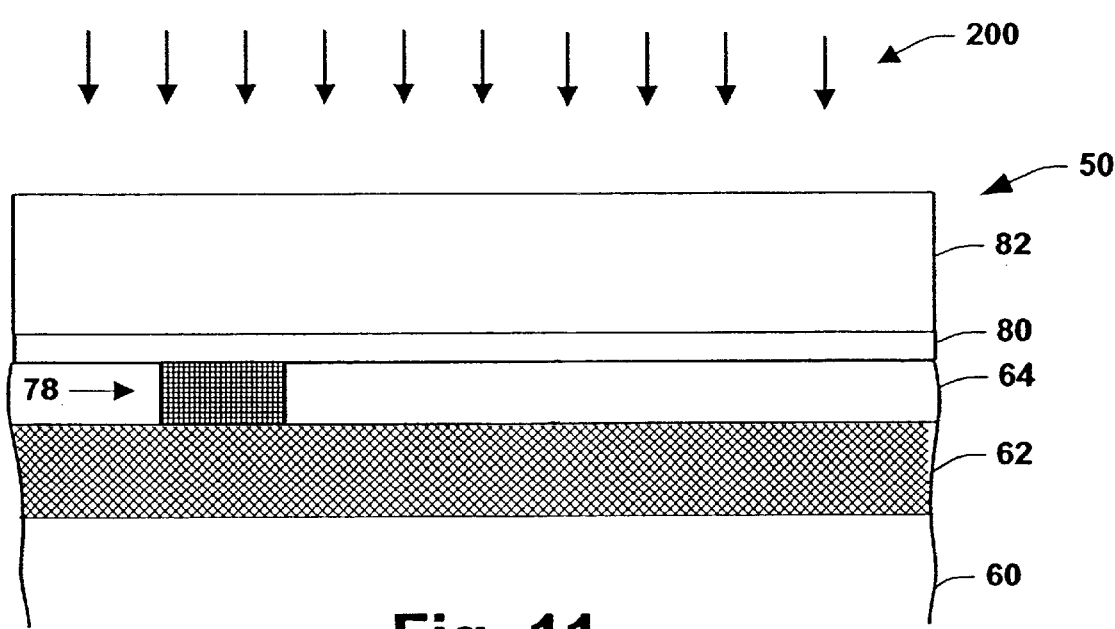
FIG. 11 is a schematic cross-sectional illustration of the structure of FIG. 10 undergoing an etch to form a ground contact opening in the insulating layer in accordance with one aspect of the present invention.
Figure 12:
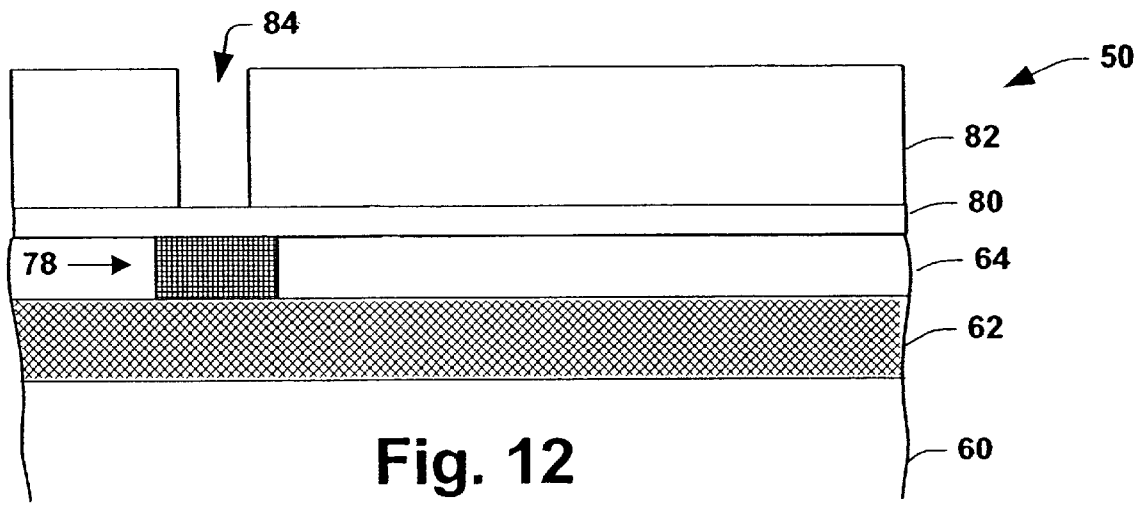
FIG. 12 is a schematic cross-sectional illustration of the structure of FIG. 11 after the etch is substantially complete in accordance with one aspect of the present invention.
Figure 13:
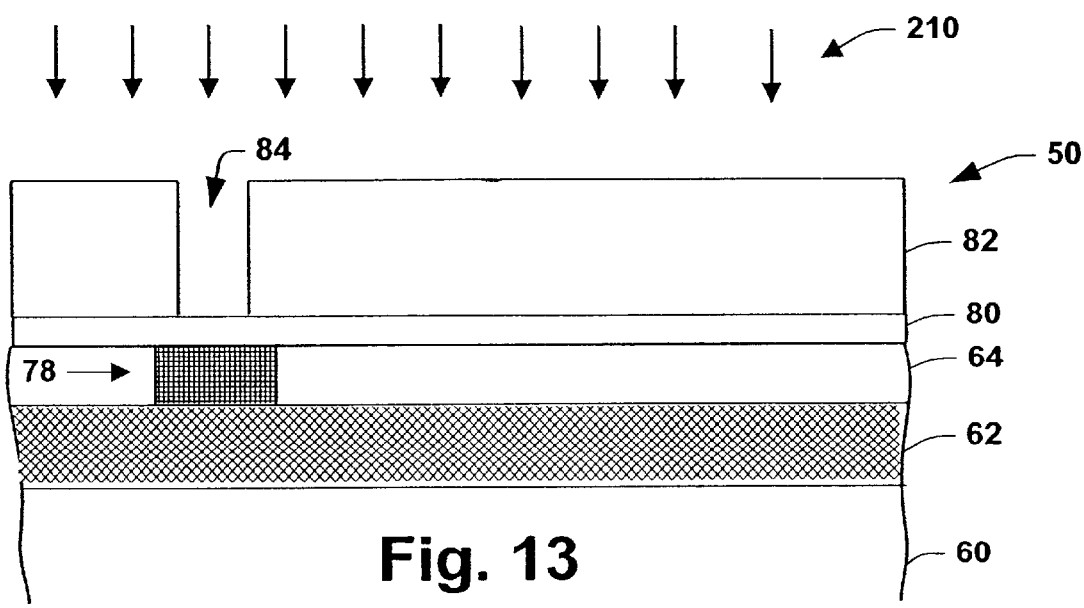
FIG. 13 is a schematic cross-sectional illustration of the structure of FIG. 12 undergoing an etch to extend the ground contact opening to the oxide layer in accordance with one aspect of the present invention.

FIG. 10 illustrates an insulating material 82 (FIG. 1) being laid down on the stop layer 80. Any suitable technique (e.g., thermal oxidation, plasma enhanced chemical vapor deposition (CVD), thermal enhanced CVD and spin on techniques) may be employed in forming the insulating layer 82. Preferably, the insulating layer 82 is silicon dioxide ($SiO_2$) with a thickness of about 0.8 to 1.0 microns. Other usuable insulating materials are silicon nitride ($Si_3N_4$), (SiN), silicon oxynitride ($SiO_xN_y$), and fluonated silicon oxide ($SiO_xF_y$), and polyimide(s). It is to be appreciated that multiple insulating layers of oxides and nitrides can be implemented to carry out the present invention. For example, a single trench oxide layer and a single trench nitride layer can be etched to form the trenches and a single via oxide layer and a single via nitride layer can be disposed below the trench layers and etched to form the vias. The present example includes a single insulating layer for the sake of simplicity.

A photoresist layer (not shown) is formed on the insulating layer 82. The photoresist layer has a thickness suitable for functioning as a mask for etching the underlying insulating layer 82. An etch 200 (e.g., anisotropic reactive ion etching (RIE)) (FIG. 11) is performed to form a large via 84 (FIG. 12) in the insulating layer 82. Any suitable etch technique may be used to etch the insulating layer 82. For example, the insulating layer 82 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer to thereby create the large via 84. Preferably, a selective etch technique is used to etch the material of the insulating layer 82 at a relatively greater rate as compared to the patterned photoresist and underlying stop layer 80. The stop layer 80 protects the top silicon layer 64 from etching of the insulating layer 82, so that the etching 200 does not gouge into the top silicon layer 64.

Figure 14:
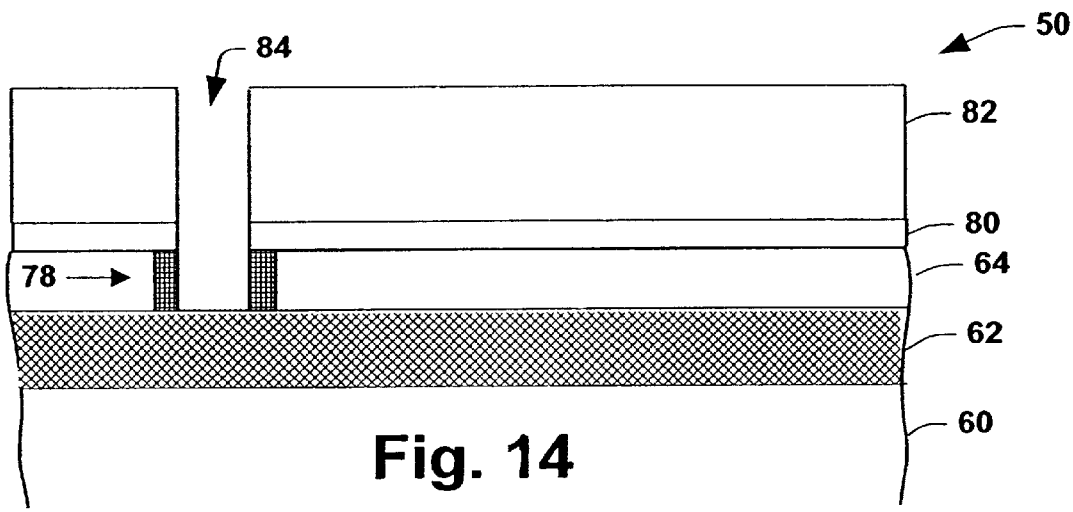
FIG. 14 is a schematic cross-sectional illustration of the structure of FIG. 13 after the etch is substantially complete in accordance with one aspect of the present invention.
Figure 15:
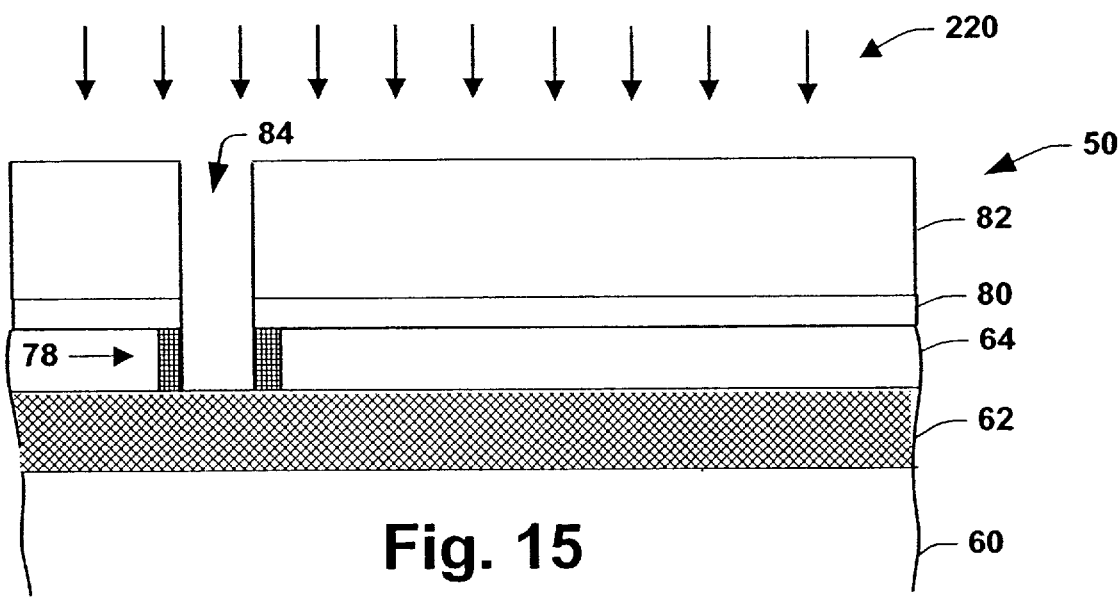
FIG. 15 is a schematic cross-sectional illustration of the structure of FIG. 14 undergoing another etch to extend the ground contact opening to the silicon layer in accordance with one aspect of the present invention.
Figure 16:
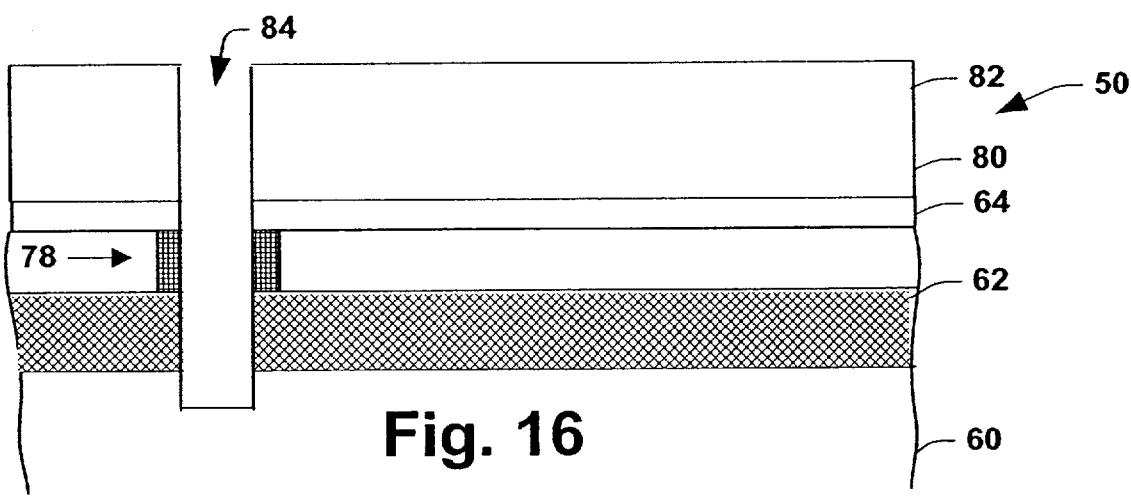
FIG. 16 is a schematic cross-sectional illustration of the structure of FIG. 15 after the etch is substantially complete in accordance with one aspect of the present invention.

An etch 210 (e.g., anisotropic reactive ion etching (RIE)) (FIG. 13) is performed to extend the large via 84 through the stop layer and shallow isolation trench 78 to the underlying oxide layer 62 (FIG. 14). Preferably, a selective etch technique is used to etch the material of the stop layer 80 and shallow isolation trench 78 at a relatively greater rate as compared to the underlying oxide layer 62. An etch 220 (e.g., anisotropic reactive ion etching (RIE)) (FIG. 15) is performed to extend the large via 84 through the oxide layer 62 and partially into the silicon layer 60 (FIG. 16).

Figure 17:
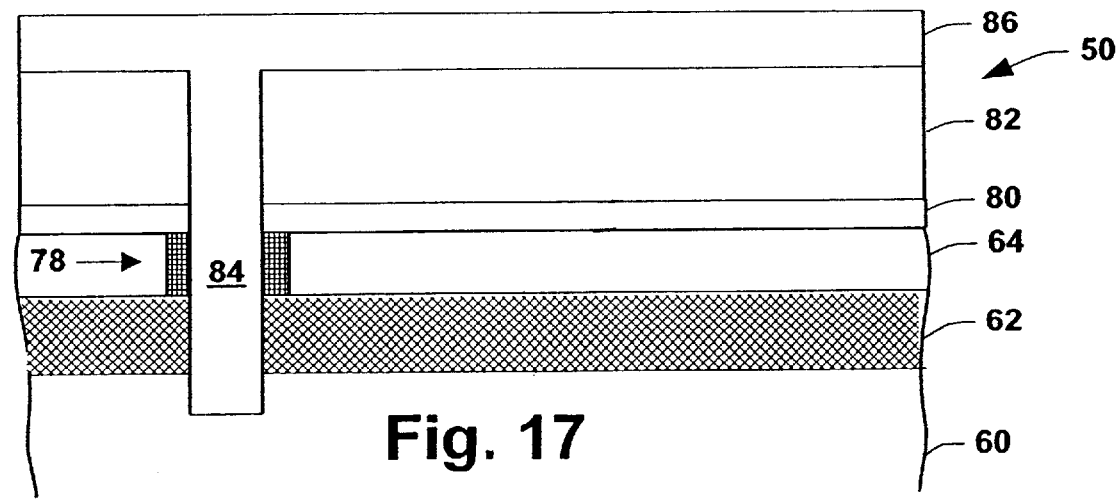
FIG. 17 is a schematic cross-sectional illustration of the structure of FIG. 16 after a photoresist layer has been formed on the structure in accordance with one aspect of the present invention.
Figure 18:
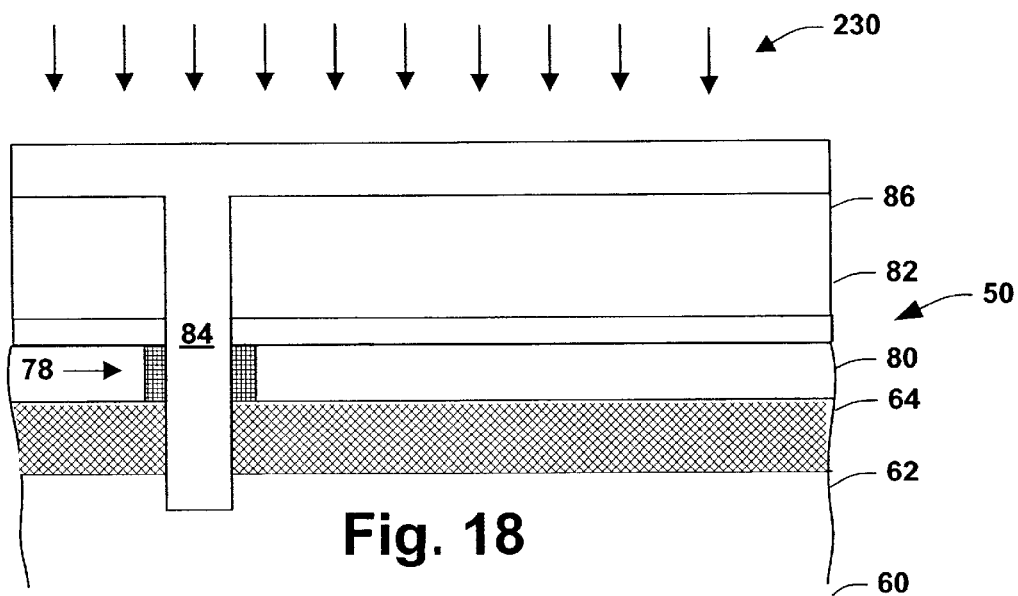
FIG. 18 is a schematic cross-sectional illustration of the structure of FIG. 17 undergoing patterning of the photoresist layer in accordance with one aspect of the present invention.
Figure 19:
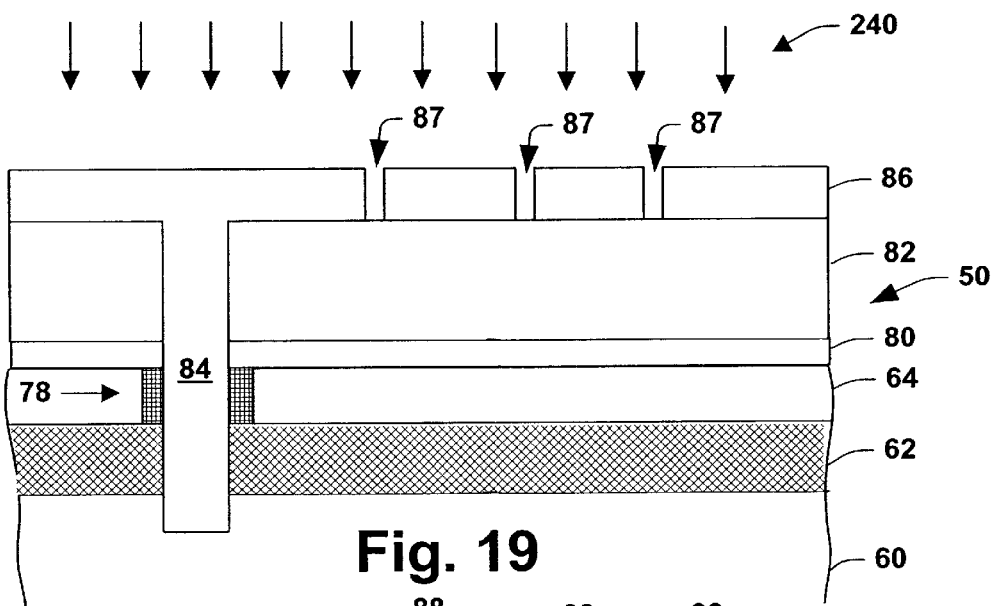
FIG. 19 is a schematic cross-sectional illustration of the structure of FIG. 18 undergoing an etch to form vias and trenches in the insulation layer in accordance with one aspect of the present invention.
Figure 20:
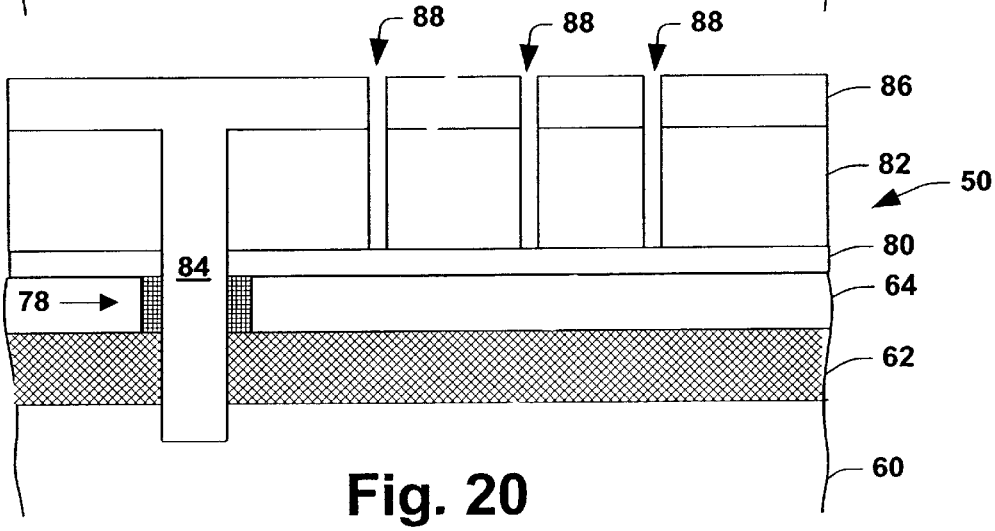
FIG. 20 is a schematic cross-sectional illustration of the structure of FIG. 19 after undergoing the etch to form vias and trenches in the insulation layer in accordance with one aspect of the present invention.

FIG. 17 illustrates a second photoresist layer 86 formed on the SOI structure 50. The photoresist layer 86 has a thickness of about 500 Å–5000 Å, however, it is to be appreciated that the thickness thereof may be of any dimension suitable for carrying out the present invention. Accordingly, the thickness of the photoresist layer 86 can vary in correspondence with the wavelength of radiation used to pattern the photoresist layer 86. The photoresist layer 86 may be formed over the insulating layer 82 via conventional spin-coating or spin casting deposition techniques. The photoresist material fills the large via 86, but can be easily stripped away due to the size of the large via 84 and, thus, does not affect normal contact patterning.

Figure 21:
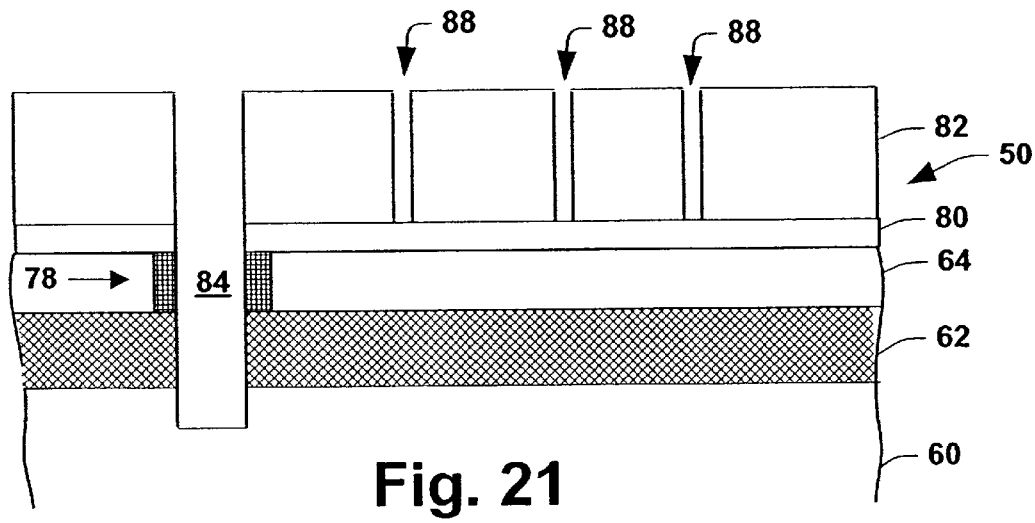
FIG. 21 is a schematic cross-sectional illustration of the structure of FIG. 20 after undergoing a strip of excess photoresist in accordance with one aspect of the present invention.
Figure 22:
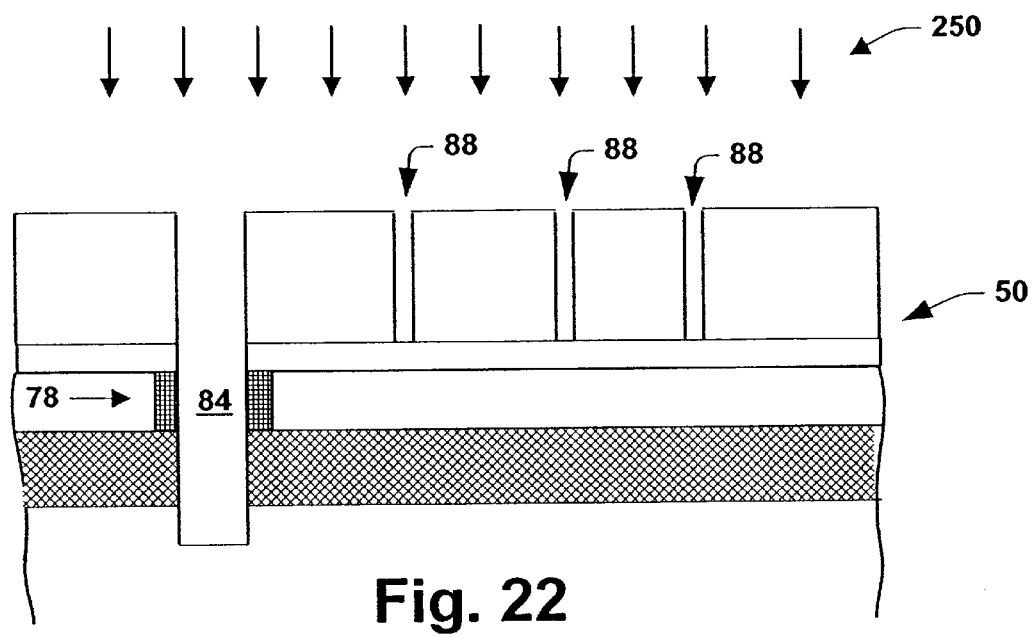
FIG. 22 is a schematic cross-sectional illustration of the structure of FIG. 21 undergoing an etch to extend the vias and trenches through the stop layer to the top silicon layer in accordance with one aspect of the present invention.

The second photoresist layer 86 is patterned 230 (FIG. 18) to form via and trench openings 87 (FIG. 19) about the size of the ultimate vias and trenches to be formed in the insulating layer 82. An etch 240 ((e.g., anisotropic reactive ion etching (RIE)) is performed (FIG. 19) to form vias and trenches (FIG. 20) in the insulation layer 82, so that contacts and conducting lines can be provided. Any suitable etch technique may be used to etch the insulation layer 82. For example, the insulation layer 82 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer 86 to thereby create the vias and trenches 88 in the insulation layer 82. Preferably, a selective etch technique is used to etch the material of the insulating layer 82 at a relatively greater rate as compared to the patterned photoresist 86 and the underlying stop layer 80. The stop layer 80 protects the top silicon layer 64 from etching of the insulating layer 82, so that the etching 240 does not gouge into the top silicon layer 64. FIG. 21 illustrates a partially complete SOI structure after a stripping step (e.g., ashing in an $O_2$ plasma) is substantially complete to remove remaining portions of the patterned photoresist layer 86.

Figure 23:
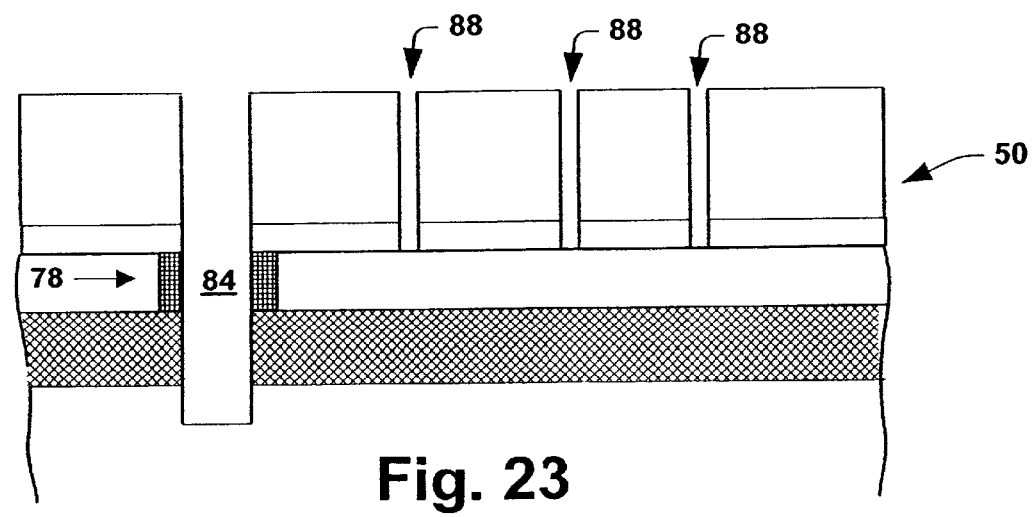
FIG. 23 is a schematic cross-sectional illustration of the structure of FIG. 22 after undergoing the etch to extend the vias and trenches through the stop layer to the top silicon layer in accordance with one aspect of the present invention.
Figure 24:
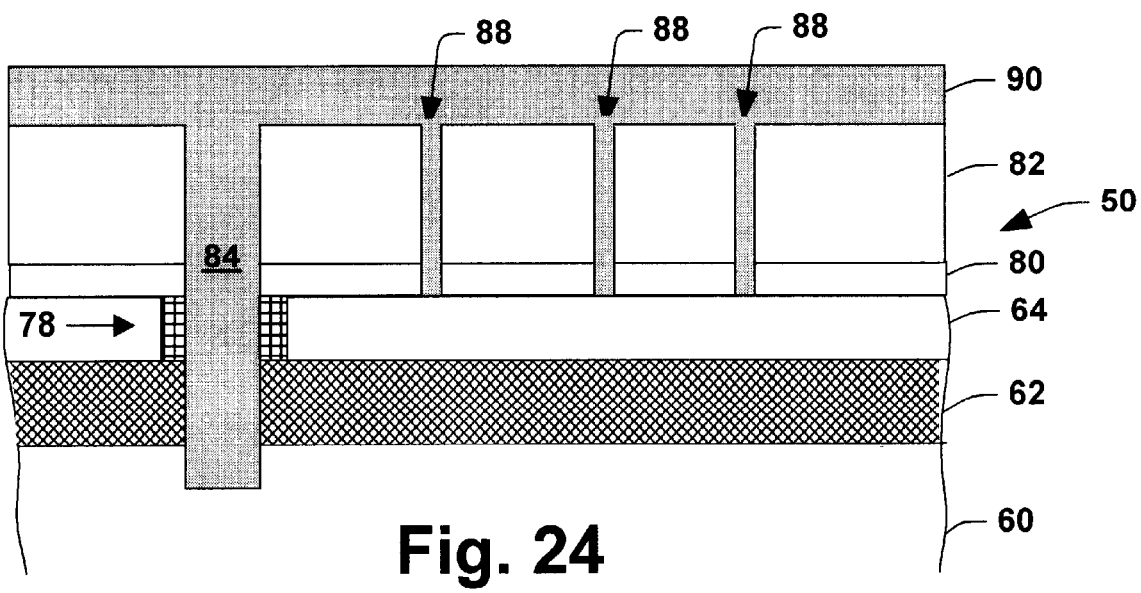
FIG. 24 is a schematic cross-sectional illustration of the structure of FIG. 23 undergoing a conductive line and contact fill in accordance with one aspect of the present invention.
Figure 25:
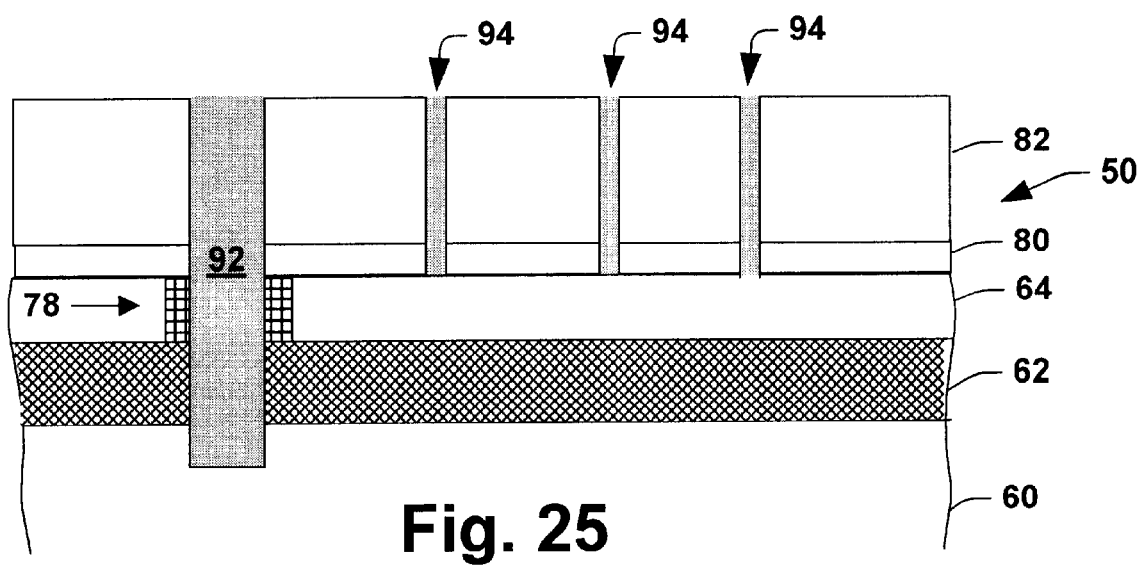
FIG. 25 is a schematic cross-sectional illustration of the structure of FIG. 24 after undergoing polishing in accordance with one aspect of the present invention.

An etch 250 (e.g., anisotropic reactive ion etching (RIE)) (FIG. 22) is performed to extend the vias and trenches 88 through the stop layer to the underlying silicon layer 64 (FIG. 23). Preferably, a selective etch technique is used to etch the material of the stop layer 80 at a relatively greater rate as compared to the underlying silicon layer 64. Next, a deposition is performed on the structure of FIG. 23. The deposition includes depositing a tungsten layer 90 having a thickness of about 800–1000 Å to provide the structure of FIG. 24. A polished back is performed to remove a predetermined thickness of the tungsten layer 90. Preferably, the polished back is performed to remove an amount of the tungsten layer 90 equivalent to the thickness of tungsten layer 90 overlying the insulating layer 82. The resultant structure is illustrated in FIG. 25 and includes a ground contact 92 and contacts and conducting lines 94. Substantially the same fabrication methodology may be employed in the fabrication of such an n-channel device as a bulk device as compared to the discussed SOI type device. One skilled in the art could readily tailor the above to form such n-channel devices based on the discussion herein, and therefore further discussion related thereto is omitted for sake of brevity.

What has been described above are certain aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating local interconnects in an insulating material overlaying an SOI device comprising:

providing an SOI structure having a substrate layer, an oxide layer over the substrate layer and a silicon layer over the oxide layer;

forming at least one isolation trench in the silicon layer;

forming an insulating layer over the silicon layer;

forming a ground opening extending from a top surface of the insulating layer through the at least one trench isolation to the substrate layer;

forming at least one local interconnect opening in the insulating layer extending from the top surface of the insulating layer to the silicon layer, wherein forming the local interconnect opening is performed after forming the ground opening;

filling the ground opening and the local interconnect opening with a contact material layer; and polishing back the contact material layer to the insulating layer to form a ground contact from the top surface of the insulating layer to the substrate layer and a local interconnect contact from the top surface of the insulating layer to the silicon layer.

2. The method of claim 1 the insulating layer contains at least one material selected from a group consisting of silicon oxide, silicon dioxide, silicon nitride ($Si_3N_4$), (SiN), silicon oxynitride, ($SiO_xN_y$), fluonated silicon oxide ($SiO_xF_y$), and polyimide(s).

3. The method of claim 1 the contact material layer contains at least one material selected from a group consisting of tungsten and a tungsten alloy.

4. The method of claim 1, further comprising forming a stop layer over the silicon layer prior to forming an insulating layer over the silicon layer, the stop layer residing between the insulating layer and the silicon layer.

5. The method of claim 4, the stop layer contains at least one material selected from a group consisting of silicon nitride (SiN), silicon oxynitride (SiON) and titanium nitride (TiN).

6. The method of claim 1 wherein forming the stop layer comprises forming the stop layer to have a thickness within the range of about 50 Å–2000 Å.

7. The method of claim 1 wherein forming the ground opening comprises performing a first etching to etch an opening in the insulating layer to a stop layer, extending the opening by performing a second etching through the stop layer and the isolation trench and then performing a third etching through the oxide layer and partially into the substrate layer.

8. The method of claim 7 wherein the first etching is highly selective to the insulating layer over the underlying stop layer.

9. The method of claim 7, wherein the second etching is highly selective to the stop layer and isolation trench layer over the underlying oxide layer.

10. The method of claim 1, wherein forming a local interconnect opening comprises forming a photoresist layer over the insulating layer, the photoresist layer filling the ground opening.

11. The method of claim 10, wherein forming a local interconnect opening further comprises patterning layer photoresist layer with a contact opening, etching the opening into the insulation layer by performing a first etching through the insulation layer and stripping the photoresist layer from the insulating layer and the ground opening.

12. The method of claim 11 further comprising extending the opening through a stop layer to the silicon layer by performing a second etching.

13. The method of claim 12 wherein the first etching is highly selective to the insulating layer over the underlying stop layer.

14. The method of claim 13 wherein the second etching is highly selective to the stop layer over the underlying silicon layer.

15. A method for fabricating local interconnects in an insulating material overlaying an SOI device comprising:

providing an SOI structure having a substrate layer, an oxide layer over the substrate layer and a silicon layer over the oxide layer;

forming at least one isolation trench in the silicon layer;

forming a stop layer over the silicon layer;

forming an insulating layer over the stop layer;

etching a ground opening extending from a top surface of the insulating layer through the at least one trench isolation to the substrate layer;

forming a photoresist layer over the insulating layer, the photoresist layer filling the ground opening;

patterning the photoresist layer with an opening;

extending the opening into the insulating layer by performing a first etching through the opening in the photoresist layer;

stripping the photoresist layer from the insulating layer and the ground opening;

extending the opening through the stop layer to the top silicon layer by performing a second etch to form a local interconnect opening;

filling the ground opening and the local interconnect opening with a contact material layer; and polishing back the contact material layer to the insulating layer to form a ground contact from top surface of the insulating layer to the substrate layer and a local interconnect contact from the top surface of the insulating layer to the silicon layer.

* * * * *